United States Patent
Raj et al.

(10) Patent No.: US 12,531,565 B2
(45) Date of Patent: Jan. 20, 2026

(54) ANALOG-TO-DIGITAL CONVERTER WITH INSTABILITY RECOVERY CIRCUIT

(71) Applicant: Texas Instruments Incorporated, Dallas, TX (US)

(72) Inventors: Jyoti Raj, Bangalore (IN); Anand Subramanian, Bangalore (IN); Anand Kannan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 18/591,676

(22) Filed: Feb. 29, 2024

(65) Prior Publication Data

US 2025/0030429 A1    Jan. 23, 2025

(30) Foreign Application Priority Data

Jul. 21, 2023   (IN) .............................. 202341049171

(51) Int. Cl.
*H03M 1/06* (2006.01)
*H03M 3/00* (2006.01)

(52) U.S. Cl.
CPC ......... *H03M 1/0604* (2013.01); *H03M 3/394* (2013.01); *H03M 3/454* (2013.01); *H03M 3/464* (2013.01); *H03M 3/488* (2013.01)

(58) Field of Classification Search
CPC .... H03M 1/0604; H03M 3/454; H03M 3/464; H03M 3/488; H03M 3/394
USPC .......................................... 341/118, 143, 155
See application file for complete search history.

(56) References Cited

U.S. PATENT DOCUMENTS 6,087,969 A * 7/2000 Stockstad ............. H03M 3/394
341/143
7,129,873 B2 * 10/2006 Kawamura ......... H03M 7/3015
341/143

* cited by examiner

*Primary Examiner* — Khai M Nguyen
(74) *Attorney, Agent, or Firm* — Mandy Barsilai Fernandez; Frank D. Cimino

(57) ABSTRACT

In described examples, an integrated circuit (IC) includes first and second integrators, first and second weighted summers, first and second digital-to-analog converters (DACs), and a quantizer. First and second inputs of the first weighted summer are respectively connected to an output of the first integrator and an output of the second DAC. An input of the second integrator is connected to an output of the first weighted summer. An input of the second weighted summer is connected to an output of the second integrator. An input of the quantizer is connected to an output of the second weighted summer. Inputs of the first and second DACs are connected to respective outputs of the quantizer. An output of the first DAC is connected to a first input of the first integrator. A second input of the first integrator and a third input of the first weighted summer are analog signal inputs.

20 Claims, 8 Drawing Sheets

ANALOG-TO-DIGITAL CONVERTER WITH INSTABILITY RECOVERY CIRCUIT

CROSS-REFERENCE TO RELATED APPLICATION

This application claims the benefit of and priority to India Provisional Application No. 202341049171, filed Jul. 21, 2023, which is incorporated herein by reference.

TECHNICAL FIELD

This application relates generally to analog-to-digital converters (ADCs), and more particularly to continuous time delta sigma modulator (CTDSM) ADCs.

BACKGROUND

ADCs are used in a variety of applications to convert analog input signals into digital signals to enable digital signal processing. In some examples, increasing ADC resolution increases power or area cost of the ADC. Some applications, such as audio processing, have use cases that favor high resolution signal processing with reduced power draw and smaller device footprint. Battery powered audio devices, such as mobile phones, provide an example use case for ADCs with reduced power and area budgets.

SUMMARY

In described examples, an integrated circuit (IC) includes first and second integrators, first and second weighted summers, first and second digital-to-analog converters (DACs), and a quantizer. First and second inputs of the first weighted summer are respectively connected to an output of the first integrator and an output of the second DAC. An input of the second integrator is connected to an output of the first weighted summer. An input of the second weighted summer is connected to an output of the second integrator. An input of the quantizer is connected to an output of the second weighted summer. Inputs of the first and second DACs are connected to respective outputs of the quantizer. An output of the first DAC is connected to a first input of the first integrator. A second input of the first integrator and a third input of the first weighted summer are analog signal inputs.

In described examples, an IC includes a delta-sigma modulator (DSM) and a control circuit that operates the DSM in first and second modes. The DSM includes N>1 integrators, a first DAC, a second DAC, and a quantizer. In the first mode, the control circuit operates the DSM as an Nth order modulator, so that integrator outputs are responsive to a first feedback signal provided by the first DAC responsive to quantizer output. In the second mode, the control circuit operates the DSM as a first order modulator, so that quantizer output is responsive to an output of a single one of the integrators, to a second feedback signal provided by the second DAC responsive to quantizer output, and not to the first feedback signal. The control circuit switches from the first mode to the second mode responsive to an output of an integrator and a threshold.

In described examples, an IC includes a lowpass analog filter, a sampling circuit, first and second integrators, first and second weighted summers, first and second DACs, a quantizer, and a lowpass digital filter. An input of the sampling circuit is connected to an output of the lowpass analog filter. A first input of the first integrator is connected to an output of the sampling circuit. First, second, and third inputs of the first weighted summer are respectively connected to an output of the first integrator, an output of the second DAC, and the output of the sampling circuit. An input of the second integrator is connected to an output of the first weighted summer. An input of the second weighted summer is connected to an output of the second integrator. An input of the quantizer is connected to an output of the second weighted summer. Inputs of the first and second DACs are connected to respective outputs of the quantizer. An output of the first DAC is connected to a second input of the first integrator. A second input of the first integrator and a third input of the first weighted summer are analog signal inputs.

DETAILED DESCRIPTION

Figure 1A:
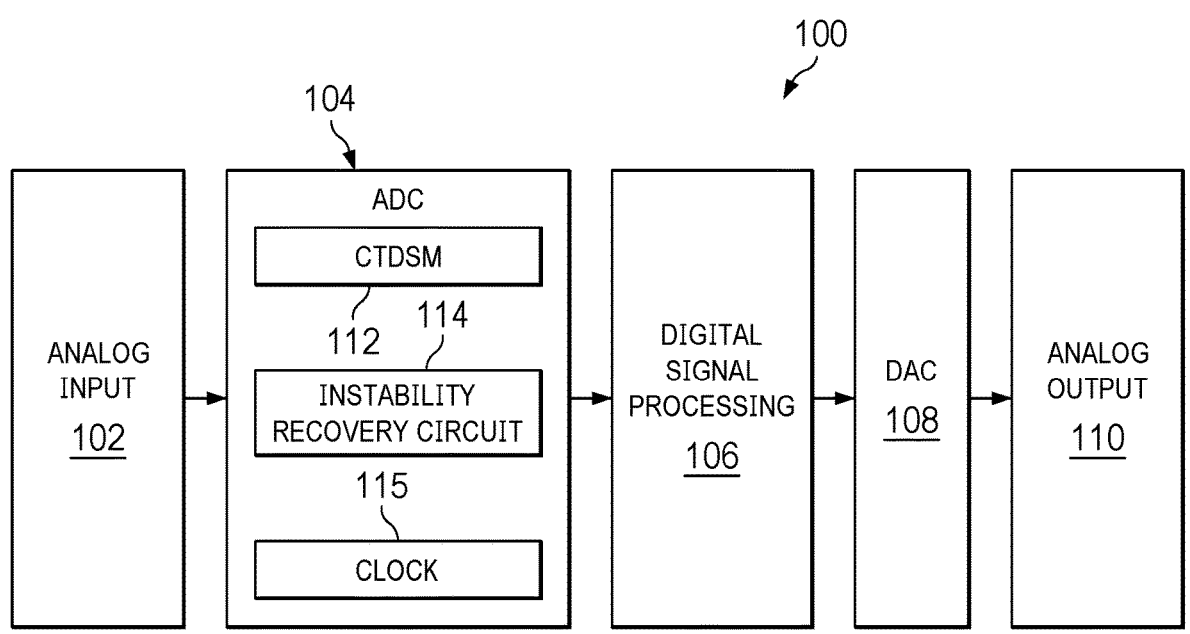
FIG. 1A is a functional block diagram of an example system that includes an ADC with a CTDSM controlled by an instability recovery circuit.

Some ADCs use a CTDSM to convert an analog signal into a digital signal. A CTDSM includes a delta block that receives the analog signal, a sigma block, a quantizer, and a feedback path from the quantizer to the delta block via a primary (first) digital-to-analog converter (DAC) that provides a feedback signal. The delta block provides a signal to the sigma block that is responsive to a differential between the analog signal and the feedback signal. The sigma block integrates (sums over time) the signals it receives from the delta block. The resulting integrated signal(s) are weighted to balance signal contributions, and the weighted results are provided to the quantizer to generate an output signal of the CTDSM.

A complexity of the sigma block is related to an order of the modulator. In some examples, a higher order (more complex) modulator enables a higher resolution (or precision) output signal, at the cost of a certain amount of reliability of the stability of the modulator. In some examples, a finite impulse response (FIR) filter, feeding the primary DAC as part of the feedback loop, further enhances a resolution of the CTDSM during nominal operation, at an additional cost of reliability of the stability of the modulator.

Certain changes in input signal amplitude may cause the CTDSM to saturate. In a saturation condition, certain internal signals of the CTDSM oscillate between a maximum level and a minimum level, preventing accurate operation of the CTDSM. In some examples, a high frequency, low amplitude change in the input signal cause the CTDSM to saturate or enter another unstable condition. In some examples, a change resulting in the CTDSM receiving a signal with amplitude equal to or greater than a maximum signal amplitude (MSA) that the CTDSM is designed to process, regardless of change frequency, causes saturation or another unstable condition. Unstable conditions of the CTDSM, including saturation, are also referred to herein as instability conditions.

The instability condition can be detected by comparing signal levels at different points within the CTDSM to different corresponding thresholds. These different internal signals may be selected so that different causes of saturation or other instability are detected, for example, high frequency, lower amplitude changes in input signals, or large amplitude (or large amplitude changes in) input signals.

When a saturation or other instability condition is detected, the CTDSM downshifts its modulator order, so that the CTDSM uses a simpler sigma block. In the simplified configuration, the CTDSM uses a second DAC that enables a smaller feedback loop (including fewer components in the loop) that feeds the simpler sigma block, avoiding an output signal from the (potentially stability-reducing) FIR filter. Reducing the modulator order and not including the FIR filter output signal within the CTDSM output signal path facilitates stabilizing the CTDSM. Meanwhile, the inputs of the FIR filter and the primary DAC continue to receive output signals from the quantizer, enabling the FIR filter and the primary DAC to continue to be updated. The FIR filter and the primary DAC being updated during downshifted operation enables a smooth return to nominal operation once the CTDSM has been stabilized.

In some examples, the CTDSM returns to nominal operation via an additional mode that is intermediate between the downshifted sigma block mode and the nominal, more complex sigma block mode. In the intermediate state, the CTDSM uses a sigma block of intermediate complexity, and uses the original feedback path via the FIR filter and primary DAC. In some examples, using the intermediate mode during recovery enables a shallower recovery path, so that transients corresponding to departures from accurate CTDSM output signals are minimized on return to nominal operation of the CTDSM in the original, full complexity configuration.

Herein, some structures or signals that are distinct but related have reference numbers that use a [number][letter] format, such as switches 228a, 228b, and 228c. In some examples, these structures or signals are referred to generally, in the singular or as a group, using the [number] and without the [letter], such as the switches 228. Also, the same reference numbers or other reference designators are used in the drawings to designate features that are related structurally and/or functionally.

FIG. 1A is a functional block diagram of an example system 100 that includes an ADC 104 with a CTDSM 112 controlled by an instability recovery circuit 114. The system 100 also includes an analog input 102, a digital signal processing circuit 106, a DAC 108, and an analog output 110. In some examples, the analog input 102 is or includes an audio device such as a microphone or a memory circuit, or a temperature, pressure, force, voltage, current, or other sensor, with an analog output that provides an input signal to the ADC 104. The ADC 104 includes a clock 115 that provides a clock signal. In some examples, the digital signal processing block 106 includes a processor circuit such as a central processing unit (CPU), a digital signal processor (DSP), or a microcontroller unit (MCU). In some examples, the analog input 102 or the analog output 110 includes an amplifier, such as a class D amplifier.

In some examples, the CTDSM 112 and the instability recovery circuit 114 are fabricated on an integrated circuit (IC). In some examples, the ADC 104 is fabricated on the IC. In some examples, the IC also includes the digital signal processing circuit 106 and/or the DAC 108.

A CTDSM 112 enables sampling of analog signals at a first frequency, which are converted into relatively high resolution digital signals at a second frequency that is lower than the first frequency. This process uses a relatively low precision ADC, which is enabled to operate as a relatively high precision ADC using a combination of oversampling and noise shaping to move quantization noise out of a signal band, e.g., a bandwidth of the CTDSM 112, into higher frequencies. The higher frequency noise can be filtered, leaving a signal with an elevated signal-to-noise ratio (SNR), and accordingly an elevated resolution.

In some examples, the designed gain of a CTDSM 112, determined by a signal transfer function (STF) of the CTDSM 112, is a constant, such as one. In some examples, an ADC converts an analog signal into a digital signal representing the same information, such as frequency and amplitude. In some examples, certain types of input signals, such as a step input, can cause instability in an output signal of the CTDSM 112. A step input is a relatively large change in input amplitude in a relatively short amount of time, which can alternatively be expressed as a large change in input amplitude at a high frequency. In some examples, the meaning of a relatively large change is responsive to the duration over which the input signal amplitude changes. At sufficiently high frequencies, or equivalently over a sufficiently short amount of time, a step input capable of causing instability in an output signal of the CTDSM 112 can be very small compared to the MSA of the CTDSM 112.

In some examples, instability in the output signal of the CTDSM 112 corresponds to the CTDSM 112 saturating. Saturation corresponds to relatively large transient overshoots in an output signal of the CTDSM 112. Accordingly, instability in the output signal of the CTDSM 112 can correspond to the output signal of the CTDSM 112 departing from the designed gain of the CTDSM 112. In some examples, a transfer function of the CTDSM 112 leads to higher gain at higher frequencies. The instability recovery circuit 114 controls the CTDSM 112 to reliably recover from an unstable condition, such as saturation, to return to accurate, stable function. The CTDSM 112 is further described with respect to FIG. 1B and subsequent figures.

Figure 1B:
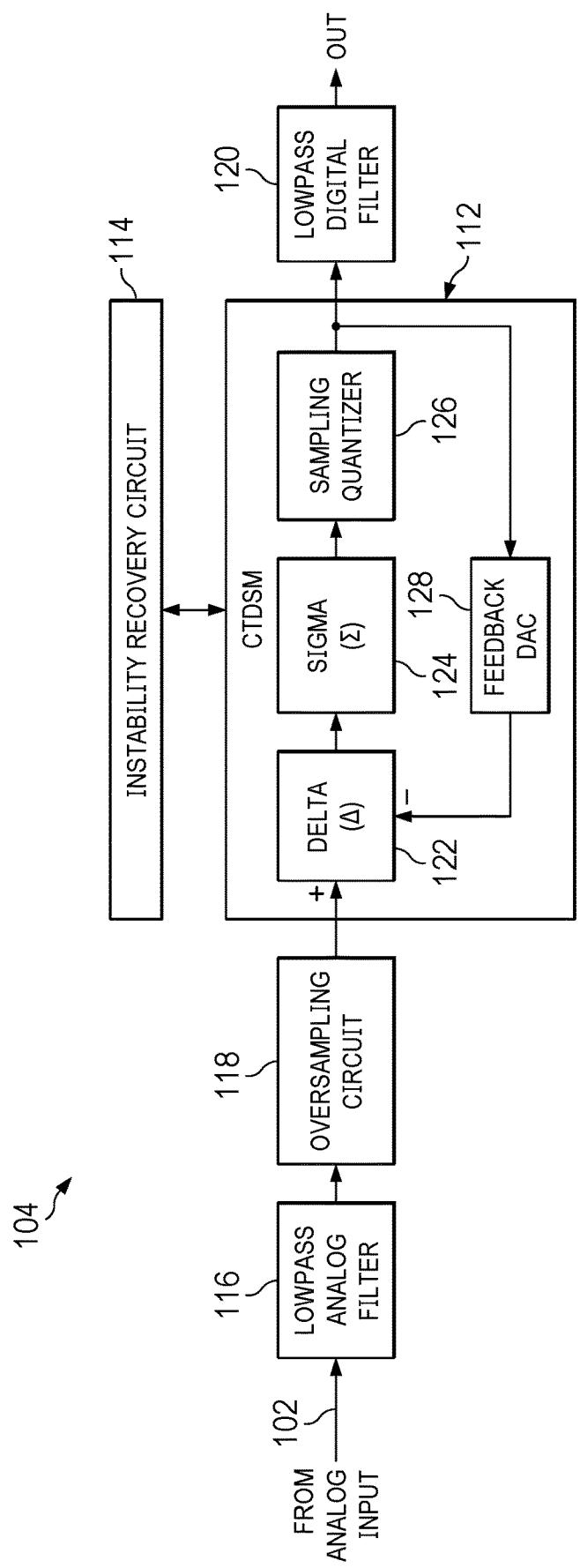
FIG. 1B is a functional block diagram of an example of the ADC of FIG. 1A.

FIG. 1B is a functional block diagram of an example of the ADC 104 of FIG. 1A. The ADC 104 includes a lowpass analog filter 116, an oversampling circuit 118, the CTDSM 112, the instability recovery circuit 114, and a lowpass digital filter 120. The CTDSM 112 includes a delta (Δ) block 122, a sigma (Σ) block 124, a sampling quantizer 126, and a feedback DAC 128. In some examples, the sampling quantizer 126 is implemented using a relatively low resolution ADC, such as a 1-bit DAC, a 5-bit DAC, or a 6-bit DAC.

An output of the lowpass analog filter 116 is connected to an input of the oversampling circuit 118. An output of the oversampling circuit 118 is connected to a noninverting input of the delta block 122. An output of the delta block 122 is connected to an input of the sigma block 124. An output of the sigma block 124 is connected to an input of the sampling quantizer 126. An output of the sampling quantizer 126 is connected to an input of the lowpass digital filter 120 and an input of the feedback DAC 128. An output of the feedback DAC 128 is connected to an inverting input of the delta block 122. The CTDSM 112 is communicatively connected with the instability recovery circuit 114. An output of the lowpass digital filter 120 provides a digital output signal (OUT) of the ADC 104. Accordingly, the CTDSM 112 performs analog-to-digital delta-sigma modulation on a filtered, oversampled analog signal provided by the oversampling circuit 118.

The feedback DAC 128 provides negative feedback. The delta block 122 provides a differential output signal responsive to this negative feedback to continuously correct for quantization errors, and to move quantization noise to frequencies that are significantly higher than the bandwidth of the signal received from the oversampling circuit 118. Accordingly, quantization noise is moved to sufficiently high frequencies for the lowpass digital filter 120 to filter out corresponding high-frequency noise. In some examples, the delta block 122 encodes information regarding the change in the input signal.

In some examples, the sigma block 124 accumulates the output signal of the delta block 122, so that it integrates the difference between the noninverting and inverting inputs to the delta block 122. Accordingly, that accumulation is responsive to a difference between the input signal based on the analog input 102 and the output signal of the sampling quantizer 126. In some examples, the sigma block 124 encodes information regarding the amplitude of the input signal into the signal provided to the sampling quantizer 126.

The lowpass digital filter 120 demodulates the output signal of the sampling quantizer 126, providing a relatively high bit resolution digital output signal at a sampling frequency lower than the sampling frequency of the oversampling circuit 118. An example sampling frequency of the oversampling circuit 118 is 64 times a sampling frequency of the sampling quantizer 126. An example sampling frequency of the sampling quantizer 126 is 3 megahertz (MHz). An increase in bit resolution of the output signal of the lowpass digital filter 120 over the output signal of the sampling quantizer 126 is related in magnitude to the decrease in sampling frequency from the output signal of the oversampling circuit 118 to the output signal of the sampling quantizer 126. In some examples, effects of the lowpass digital filter 120 include time averaging, which enables high accuracy in output amplitude.

Accordingly, oversampling by the oversampling circuit 118, followed by decimation by the lowpass digital filter 120, enables benefits that may include one or more of: higher accuracy in time, use of a higher linearity ADC as a sampling quantizer 126, noise shaping by moving noise to higher frequencies that can be filtered by the lowpass digital filter 120, and/or a reduced steepness requirement for analog lowpass anti-aliasing filters. Note that in some examples, a relatively lower bit resolution ADC is more linear than a relatively higher bit resolution ADC.

In some examples, a bandwidth of an input signal of the ADC 104 corresponds to an audio bandwidth, such as 20 Hz to 20 kHz. Accordingly, an example cut-off frequency of the lowpass analog filter 116 is 20 kHz, and an example cut-off frequency of the lowpass digital filter 120 is also 20 KHz.

In some examples, an oversampled ADC, such as the ADC 104, uses a relatively high sampling rate compared to a Nyquist rate (or Nyquist frequency). The Nyquist rate of a signal is twice the bandwidth of the signal. A CTDSM 112 can be used to spread quantization noise over a bandwidth responsive to the sampling rate of the ADC, while retaining signal content within a selected bandwidth. This enables the CTDSM 112 to provide relatively high output signal resolution using a relatively low bit ADC in the sampling quantizer 126. The CTDSM 112 enables this high output signal resolution by sampling the input signal at a high sampling rate compared to the Nyquist rate, and spreading quantization noise of the sampling quantizer 126 over a frequency range that is relatively broad compared to a bandwidth of the input signal. Quantization noise outside the selected bandwidth can be filtered, reducing noise, and accordingly increasing a signal-to-quantization-noise ratio (SQNR). In some examples, multiplying the sampling rate of the oversampling circuit 118 by four improves the SQNR by six decibels (dB), which corresponds to an increase in resolution of the ADC 104 of one bit. Noise shaping by the CTDSM 112 provides additional resolution improvement, as further described below.

Figure 2A:
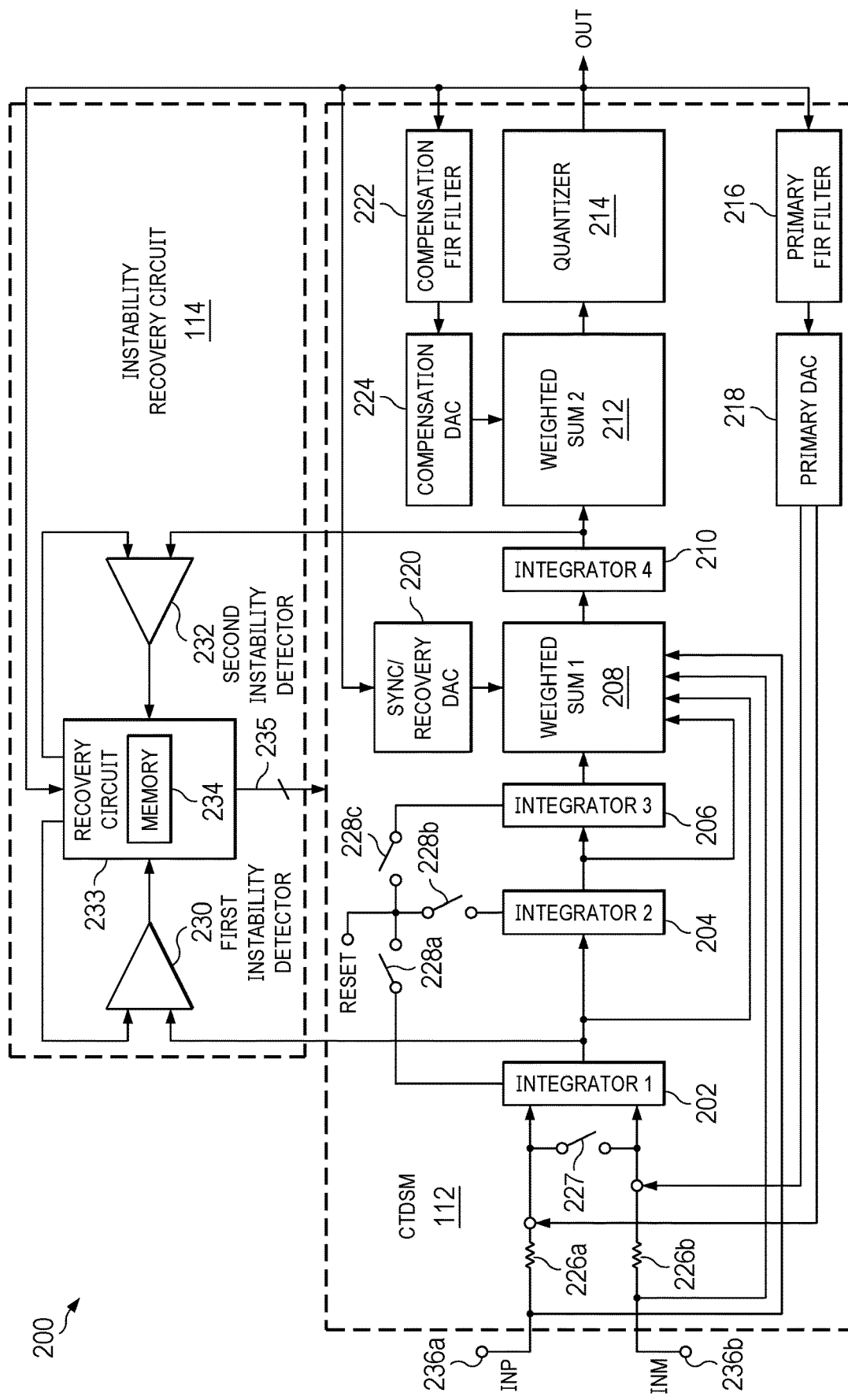
FIG. 2A is a functional block and circuit diagram of an example of a first operating state of the CTDSM and instability recovery circuit of FIGS. 1A and 1B.

FIG. 2A is a functional block and circuit diagram of an example of a first operating state 200 of the CTDSM 112 and instability recovery circuit 114 of FIGS. 1A and 1B. In some examples, in the first operating state 200, all of the functional blocks of the CTDSM 112 are active. In certain other operating states, as further described with respect to FIGS. 3 through 5, certain functional blocks of the CTDSM 112 are made inactive or at least partially inactive by the instability recovery circuit 114 to increase stability of the CTDSM 112, and/or to provide a recovery path facilitating stable initial operation on return to full, nominal functionality.

The CTDSM 112 includes a first integrator (integrator 1) 202, a second integrator (integrator 2) 204, a third integrator (integrator 3) 206, a first weighted summer (weighted sum 1) 208, a fourth integrator (integrator 4) 210, a second weighted summer (weighted sum 2) 212, a quantizer 214, a primary finite impulse response (FIR) filter 216, a primary DAC 218, a sync/recovery DAC 220, a compensation FIR filter 222, a compensation DAC 224, a first resistor 226a and a second resistor 226b, a recovery switch 227, and a first switch 228a, a second switch 228b, and a third switch 228c. The instability recovery circuit 114 includes a first instability detector (instability detector 1) 230, a second instability detector (instability detector 2) 232, and a recovery circuit 233. In some examples, the first and second instability detectors 230 and 232 are comparators. In some examples, the quantizer 214 corresponds to the sampling quantizer 126 of FIG. 1B. In some examples, the instability recovery circuit 114 or the recovery circuit 233 can be described as a control circuit of the CTDSM 112.

The sync/recovery DAC 220 is so named because it is used to compensate for loop delay, accordingly, to perform synchronization; and as part of a process by which the CTDSM 112 recovers from instability. These functions of the sync/recovery DAC 220 are further described below.

The recovery circuit 233 includes a memory 234. In some examples, the memory 234 stores one or more of instructions for execution by the recovery circuit 233, instability detector 230 and 232 threshold levels, timing values, weight coefficients for the weighted summers 208 and 212, or other parameters for the recovery circuit 233 to use to control operation of the CTDSM 112. In some examples, timing values correspond to timing for transitions between operating states such as first, second, and third operating states 200, 300, and 400 (see FIGS. 2 through 5). In some examples, timing values correspond to timing for changing other functions of the CTDSM 112, such as by releasing a reset signal of a latch 242 (see FIG. 2C).

A first input terminal 236a receives a plus input signal INP, and a second input terminal 236b receives a minus input signal INM. For example, INP and INM are plus and minus components of a differential input signal. In some examples, INP and INM are provided by a signal sampling circuit of the ADC 104, such as the oversampling circuit 118. The signal sampling circuit is used to oversample an analog input signal, such as an input signal received from the analog input 102, in some examples via a filter such as the lowpass analog filter 116.

The first input terminal 236a is connected to a first terminal of the first resistor 226a and to a first input of the first weighted summer 208. The second input terminal 236b is connected to a first terminal of the second resistor 226b and to a second input of the first weighted summer 208. A second terminal of the first resistor 226a is connected to a first terminal of the recovery switch 227, a first input of the first integrator 202, and a first output of the primary DAC 218. A second terminal of the second resistor 226b is connected to a second terminal of the recovery switch 227, a second input of the first integrator 202, and a second output of the primary DAC 218.

An output of the first integrator 202 is connected to an input of the second integrator 204, a third input of the first weighted summer 208, and a first input of the first instability detector 230. An output of the second integrator 204 is connected to an input of the third integrator 206 and a fourth input of the first weighted summer 208. An output of the third integrator 206 is connected to a fifth input of the first weighted summer 208.

Virtual grounds of the first, second, and third integrators 202, 204, and 206 may be connected via outputs of the respective integrators 202, 204, and 206, depending on a switching state of respective ones of the switches 228. A virtual ground of the first integrator 202 is connected to a first terminal of the first switch 228a, a virtual ground of the second integrator 204 is connected to a first terminal of the second switch 228b, and a virtual ground of the third integrator 206 is connected to a first terminal of the third switch 228c. The second terminal of each of the switches 228 is connected to a node that receives a RESET signal. Accordingly, closing any of the switches 228 puts the respective integrator(s) 202, 204, or 206 corresponding to the closed switch(es) 228a, 228b, or 228c into a reset state. In the reset state, a zero signal, such as a zero voltage and/or zero current signal, is provided at the output(s) of the corresponding integrator(s) 202, 204, or 206. A zero signal corresponds to a signal with will not affect a sum accumulated by an integrator 202, 204, or 206 or an output signal of a weighted summer 208 or 212. In some examples, the switches 228 are transistors, and connections from the recovery circuit 233 to the switches 228 correspond to connections to respective gates or other control terminals of the switches 228.

Alternatively, the outputs and corresponding inputs of the first, second, and third integrators 202, 204, and 206 are differential outputs and inputs, and the inputs of the first weighted summer 208 are differential inputs. The first terminal of the first switch 228a is connected to a first differential output of the first integrator 202 and a first differential input of the second integrator 202, and a second terminal of the first switch 228a is connected to a second differential output of the first integrator 202 and a second differential input of the second integrator 204. The first terminal of the second switch 228b is connected to a first differential output of the second integrator 204 and a first differential input of the third integrator 206, and a second terminal of the second switch 228b is connected to a second differential output of the second integrator 204 and a second differential input of the third integrator 206. And the first terminal of the third switch 228c is connected to a first differential output of the third integrator 206 and a first differential input of the first weighted summer 208, and a second terminal of the third switch 228c is connected to a third differential output of the first integrator 206 and a second differential input of the first weighted summer 208. Accordingly (as described above), closing any of the switches 228 puts the respective integrator(s) 202, 204, or 206 corresponding to the closed switch(es) 228a, 228b, or 228c into the reset state, in which a zero signal is provided at the output(s) of the corresponding integrator(s) 202, 204, or 206.

An output of the first weighted summer 208 is connected to an input of the fourth integrator 210. An output of the fourth integrator 210 is connected to a first input of the second weighted summer 212 and a first input of the second instability detector 232. An output of the second weighted summer 212 is connected to an input of the quantizer 214. An output of the quantizer 214 is connected to an input of the primary FIR filter 216, an input of the sync/recovery DAC 220, an input of the compensation FIR filter 222, and a first input of the recovery circuit 233.

An output of the primary FIR filter 216 is connected to an input of the primary DAC 218. An output of the compensation FIR filter 222 is connected to an input of the compensation DAC 224. An output of the compensation DAC 224 is connected to a second input of the second weighted summer 212. An output of the sync/recovery DAC 220 is connected to a sixth input of the first weighted summer 208.

An output of the first instability detector 230 is connected to a second input of the recovery circuit 233, and an output of the second instability detector 232 is connected to a third input of the recovery circuit 233. A first output of the recovery circuit 233 is connected to a second input of the first instability detector 230, and a second output of the recovery circuit 233 is connected to a second input of the second instability detector 232.

Figure 2B:
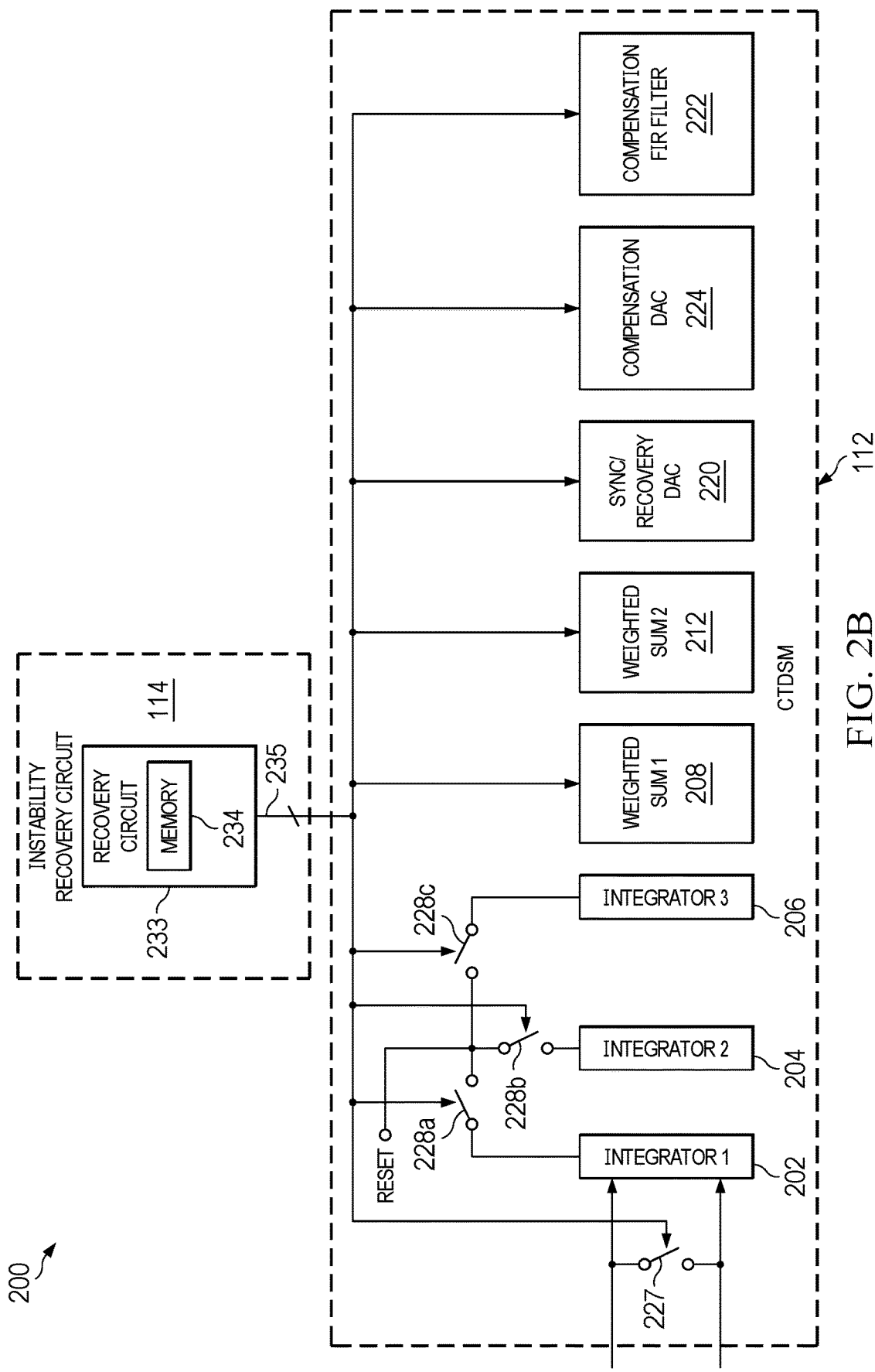
FIG. 2B is a functional block and circuit diagram of an example of the control connections from the recovery circuit to various components of the CTDSM of FIG. 2A.

A third output of the recovery circuit 233 corresponds to an output of the instability recovery circuit 114. The third output of the recovery circuit 233 is connected to a control input of the CTDSM 112. In some examples, the third output of the recovery circuit 233 is a bus that is multiple lines wide, and the control input of the CTDSM 112 accordingly corresponds to multiple input lines. In some examples, the control input of the CTDSM 112 is connected to control terminals or control inputs of the recovery switch 227, the first switch 228a, the second switch 228b, the third switch 228c, the first weighted summer 208, the second weighted summer 212, the sync/recovery DAC 220, the compensation FIR filter 222, and the compensation DAC 224. For clarity, these connections from the control input of the CTDSM 112 to control terminals or control inputs of components of the CTDSM 112 are shown in FIG. 2B, and not in FIG. 2A. During operation in the first operating state 200, the recovery circuit 233 controls the recovery switch 227 and each of the switches 228 to be open (nonconductive).

Connection of the inputs of the first integrator to the resistors 226 and to the outputs of the primary DAC 218 acts as the delta block 122 for the CTDSM 112 as shown in FIG. 2A. The first and second resistors 226 convert the signals received by the input terminals 236 into respective currents. In some examples, the outputs of the primary DAC 218 are differential outputs that sink respective currents dependent on the output signal of the primary FIR filter 216, which is dependent on the output signal of the quantizer 214. Accordingly, currents received by respective inputs of the first integrator 202 are responsive to a difference between currents provided by the resistors 226 and currents provided by (sunk) by the primary DAC 218. This enables the first integrator 202 to process quantization error, which is (or is related to) the difference between the input signal and the feedback signal, accordingly, the input signals of the first integrator 202.

Some components described with respect to the first operating state 200 of FIG. 2A are similar in function and/or structure to components described with respect to the CTDSM 112 of FIG. 1B. In some examples, in the first operating state 200 of the CTDSM 112 and instability recovery circuit 114 of FIG. 1, the connections between the first and second outputs of the primary DAC 218 and the first and second inputs of the first integrator 202, respectively, correspond to the delta block 122. The first, second, and third integrators 202, 204, and 206, the first weighted summer 208, the fourth integrator 210, and the second weighted summer 212 correspond to the sigma block 124. The quantizer 214 corresponds to the sampling quantizer 126. And the feedback DAC 128 corresponds to the primary FIR filter 216 with the primary DAC 218.

During operation in the first operating state 200, the sync/recovery DAC 220 is used to compensate for loop delay introduced by the first, second, and third integrators 202, 204, and 206, such as loop delay related to resistor-capacitor (RC) circuitry within the first, second, and third integrators 202, 204, and 206. Similarly, during operation in the first operating state 200, the compensation FIR filter 222 and compensation DAC 224 are used to compensate for loop delay introduced by the fourth integrator 210, such as loop delay related to resistor-capacitor (RC) circuitry within the fourth integrator 210. Accordingly, the sync/recovery DAC 220, compensation FIR filter 222, and compensation DAC 224 are used to achieve a designed noise transfer function (NTF) of the CTDSM 112.

In some examples, precision, or bit resolution, of an ADC is proportional to the error, or noise, in the output signal of the ADC. In some examples, the bit resolution of an ADC is proportional to the SNR expressed in dB. In an example, a six bit ADC has a 36 dB SNR, and a sixteen bit ADC has a 96 dB SNR.

As described above, the quantizer 214 is or includes an ADC. The noise in the output signal of the quantizer 214 is quantization noise. In some examples, quantization noise is a type of white noise. White noise, also called flat noise, is a noise without a preferred frequency. Such noise includes low frequency content, and can be described as not changing over time. Constant noise can be described as an offset applied to the output signal of the quantizer 214. The feedback DAC 128, delta block 122, and sigma block 124 together determine an input signal that controls the sampling quantizer 126 to produce an output signal component equal to an inverse (negative) of the offset (an inverse offset). For example, if the offset equals one, then ideally, the inverse offset equals negative one. Accordingly, the inverse offset can be determined to adjust the input signal of the quantizer 214 so that the low frequency noise in the output signal of the quantizer 214 is reduced or eliminated.

Accordingly, noise is reduced by the loop filter (the feedback loop of the CTDSM 112) and by the lowpass digital filter 120 removing high frequency signal components. This improves SNR, which enables the lowpass digital filter 120 to further increase the resolution of the ADC 104 by (or while) reducing the sample rate of the final output signal of the ADC 104. Quantization noise can be described as an additive noise source added to the output signal of the CTDSM 112. An additive noise source to output transfer function, which is related to the inverse of the NTF of the CTDSM 112, can be used to describe noise within the signal band of the CTDSM 112 as being reduced by the total gain of the integrators (202, 204, 206, and 210, corresponding to the sigma block 124). The reduced noise amplitude is transferred to higher frequencies (frequencies outside the signal band). This can be referred to as noise shaping. In an example, a sampling rate of the oversampling circuit 118 is 64 samples per second, the sigma block 124 includes four integrators, and the resolution of the ADC of the quantizer 214 is six bits, and the output signal sample rate of the ADC 104 is one sample per second and the resolution of the ADC 104 is sixteen bits.

The integrators 202, 204, 206, 210 are called integrators because they maintain a running sum of the input signal. The integrators 202, 204, 206, 210 can be described as gain blocks, providing high finite gain at low frequencies. In an example, the integrators 202, 204, 206, 210 can be implemented as analog components, such as capacitors. In another example, the integrators 202, 204, 206, 210 can be implemented as digital components, such as a summer with a memory to store the running sum. The contributions of the output signals of the integrators 202, 204, 206, and 210, the sync/recovery DAC 220, the compensation FIR filter 222, and the compensation DAC 224 to the input signal of the quantizer 214 are balanced by respective weighted summers, accordingly, the first and second weighted summers 208 and 212.

Closing the recovery switch 227 causes a zero signal or null signal to be provided to the first integrator 202. In some examples, providing a null signal to the first integrator 202 (responsive to the recovery switch 227 closing), the second integrator 204 (responsive to the first switch 228a closing), or the third integrator 206 (responsive to the second switch 228b closing) controls the respective integrator 202, 204, or 206 receiving the null signal to reset the running sum maintained by that respective integrator 202, 204, or 206.

The number of integrators in a modulator corresponds to the order of the modulator. Accordingly, in the first operating state 200, the CTDSM 112 operates as a fourth order modulator. The more integrators are present in a modulator, the more gain is available to the modulator. In some examples, integrators have high gain at low frequency and low gain at high frequency, so that signal receives more gain than quantization noise. Accordingly, an increased number of integrators can be used to enable more effective noise shaping by shifting quantization noise outside the selected bandwidth (the signal band) so that a greater proportion of quantization noise can be filtered by the lowpass digital filter 120. In some examples, this can improve resolution beyond what can be achieved by oversampling without noise shaping using integrators. Accordingly, noise shaping using both integrators and oversampling enables improved SNR, and therefore a higher resolution ADC 104 output signal for a same sampling rate of the oversampling circuit 118. In some examples, an increased number of integrators corresponds to an increased delay from a signal received at the input terminals 236 to the output signal of the quantizer 214, which may reduce stability of the CTDSM 112.

The primary FIR filter 216 reduces clock jitter sensitivity, improves the linearity of the signal response of the primary DAC 218 to reduce error in the feedback path, and filters out high frequency signal components. The clock 115 is used for, for example, sampling the input signal in the oversampling circuit 118, providing an output signal of the sigma block 124 on a first clock signal edge (such as a rising edge) within a period of the clock signal, and sampling the output signal of the sigma block 124 using the sampling quantizer 126 on a second clock edge (such as a falling edge) within the period of the clock signal. In some examples, class D amplifiers, which are switching amplifiers, produce high frequency noise at particular modulator frequencies. In some examples, class D amplifiers are used in audio-related applications.

FIR filters, such as the primary FIR filter 216 or the compensation FIR filter 222, can be described by a number of taps, corresponding to a number of samples to which an FIR filter output signal is responsive. Taps can also be described as zeroes in an STR of the FIR filter. In some examples, increasing the number of taps of a FIR filter improves the linearity and noise-filtering effects of the FIR filter, but can also increase delay and amplitude of the FIR filter output signal, reducing overall stability of the modulator. In some examples, the primary FIR filter 216 and the compensation FIR filter 222 are lowpass digital filters.

In some examples, such as at high input signal frequencies, increased delay and amplitude of the primary FIR filter output signal can lead to peaking of the STR of the primary FIR filter 216. Responsively, the CTDSM 112 may become unstable and/or have a non-unitary gain. A CTDSM 112 may be more prone to these effects as the number of taps in FIR filters of the CTDSM 112 (such as the primary and compensation FIR filters 216 and 222) increases. In some examples, the CTDSM 112 becomes unstable responsive to a step input or an input signal exceeding a designed MSA of the CTDSM 112.

In some examples, instability of the CTDSM 112 corresponds to the CTDSM 112 saturating. In a saturated condition, the primary DAC 218 oscillates between providing a voltage signal at a maximum level, such as a level corresponding to a voltage supply or other high reference voltage, and providing the voltage signal at a minimum level, such as a level corresponding to a ground or other low reference voltage.

The first and second instability detectors 230 and 232 are used to detect instability in the CTDSM 112. The recovery circuit 233 provides threshold voltages to respective second inputs of the first and second instability detectors 230 and 232. In the first operating state 200, a first threshold voltage is provided to the first instability detector 230 and a second threshold voltage is provided to the second instability detector 232.

The first instability detector 230 compares the output signal of the first integrator 202 to the first threshold voltage, and the second instability detector 232 compares the output signal of the fourth integrator 210 to the second threshold voltage. Accordingly, the first instability detector 230 is responsive to a high frequency change in input voltage (such as a step input), which may have a lower amplitude than an MSA of the CTDSM 112. The second instability detector 232 is responsive to a high amplitude change in the input signal, such as a lower frequency change in input voltage to a voltage near or greater than the MSA of the CTDSM 112. As described above, in some examples, at a sufficiently high frequency of change of input signal level, a step input that is much smaller than the MSA of the CTDSM 112 may control a signal level of the output signal of the first integrator 202 to exceed the first threshold.

If the output signal of the first integrator 202 is greater than the first threshold voltage, or the output signal of the fourth integrator 210 is greater than the second threshold voltage, then the recovery circuit 233 controls the CTDSM 112 to transition to a second operating state 300. The second operating state 300 is described with respect to FIG. 3. Accordingly, the first threshold or second threshold voltage being exceeded, as detected by the first or second instability detector 230 or 232 (respectively), indicates a saturation condition or other unstable condition of the CTDSM 112. Operation in the second operating state 300 enables the CTDSM 112 to recover from the unstable condition. Once the CTDSM 112 has recovered from the unstable condition, the recovery circuit 233 controls the CTDSM 112 to return to the first operating state 200, either directly or via a third operating state 400. The third operating state 400 is described with respect to FIG. 4.

In some examples, the first threshold voltage and the second threshold voltage each correspond to two voltages, accordingly, differential voltages. In an example, the first threshold voltages are $V_{DD}$ minus 200 millivolts and $V_{SS}$ plus 200 millivolts, and the second threshold voltages are $V_{DD}$ minus 200 millivolts and $V_{SS}$ plus 200 millivolts.

FIG. 2B is a functional block and circuit diagram of an example of the control connections from the recovery circuit 233 to various components of the CTDSM 112 of FIG. 2A. A control output of the recovery circuit 233 is connected, via a bus 235, to a control terminal of the recovery switch 227, a control terminal of the first switch 228a, a control terminal of the second switch 228b, a control terminal of the third switch 228c, a control input of the first weighted summer 208, a control input of the second weighted summer 212, a control input of the sync/recovery DAC 220, a control input of the compensation FIR filter 222, and a control input of the compensation DAC 224. In some examples, the recovery circuit 233 controls additional or different components than described herein. In some examples, the recovery circuit 233 controls additional or different component functions than described herein.

The recovery circuit 233 controls whether the recovery switch 227 is open or closed, and whether each of the switches 228 is open or closed. In some examples, closing one of the switches 228 controls the RESET signal to be provided to a respective control input of the first, second, or third integrator 202, 204, or 206. A respective virtual ground of the first, second, or third integrator 202, 204, or 206 accordingly receives a signal that controls an output of the first, second, or third integrator 202, 204, or 206 to provide a zero voltage signal or other null signal. As described above, in some examples, the recovery circuit 233 controls a different mechanism to control selected ones of the first, second, and third integrators 202, 204, and 206 to selectably provide a null signal or a normal operation signal.

The recovery circuit 233 also controls the compensation FIR filter 222 and compensation DAC 224 to selectably disconnect them from the CTDSM 112 loop or, in some examples, to provide a null signal. In subsequent figures, functional blocks that are controlled by the recovery circuit 233 to provide a null signal are indicated by dotted-line boxes. Corresponding communication lines carrying the null signals are indicated by dotted lines.

The recovery circuit 233 controls weights used by the first weighted summer 208 to determine an output signal responsive to signals provided by the input terminals 236, the first, second, and third integrators 202, 204, and 206, and the sync/recovery DAC 220. The recovery circuit 233 controls weights used by the second weighted summer 212 to determine an output signal responsive to signals provided by the fourth integrator 214 and the compensation DAC 224. Note that the output signal of the fourth integrator 214 is responsive to the output signal of the first weighted summer 208.

Figure 2C:
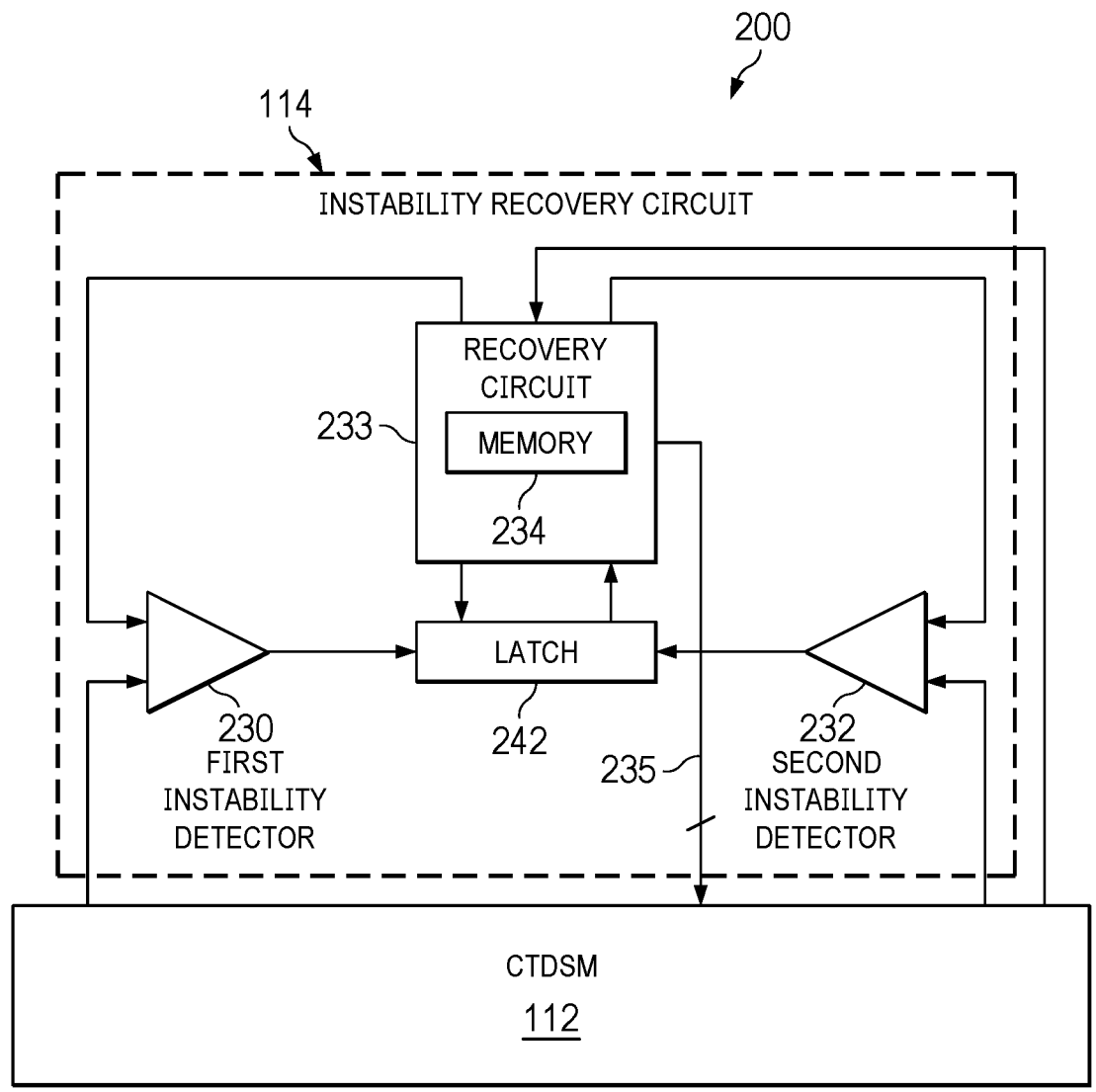
FIG. 2C is a functional block diagram of another example of the CTDSM and instability recovery circuit of FIGS. 1A and 1B.

FIG. 2C is a functional block diagram of another example of the CTDSM 112 and instability recovery circuit 114 of FIGS. 1A and 1B. In the example of FIG. 2C, the instability recovery circuit includes a latch 242. The output of the first instability detector 230 is connected to a first data input of the latch 242, and the output of the second instability detector 232 is connected to a second data input of the latch 242. A data output of the latch 242 is connected to an input of the recovery circuit 233. A reset output of the recovery circuit 233 is connected to a reset input of the latch 242.

The latch 242 stores a logic one in response to either the first or second instability detector 230 or 232 detecting an instability condition. The latch 242 communicates this logic one to the recovery circuit 233. In response, the recovery circuit 233 controls the CTDSM 112 to transition to the second operating state 300. The recovery circuit 233 controls the CTDSM 112 to remain in the second operating state 300 until the recovery circuit 233 determines, in response to the quantizer 214 output signal, that the CTDSM 112 has returned from saturation to a normal operating range.

In response to detecting the normal operating range, the recovery circuit 233 applies and holds (continues to apply) a reset signal at the reset output to the latch 242. This controls the latch 242 to reset to storing a logic zero, and forces the latch 242 to continue to store the logic zero. Accordingly, the instability detectors 230 and 232 are unable to communicate a detected instability condition to the recovery circuit 233 until the recovery circuit 233 releases (stops transmitting) the reset signal.

The recovery circuit 233 continues to hold the reset signal at the reset output to the latch 242 until the CTDSM 112 returns to nominal operation in the first operating state 200 and a predetermined amount of time passes. In some examples, a condition other than time lapse is used to determine release of the reset signal. The recovery circuit 233 then releases the reset signal at the reset output to the latch 242, which enables the first and second instability detectors 230 and 232 to return to detecting a saturation or other unstable condition.

Figure 3:
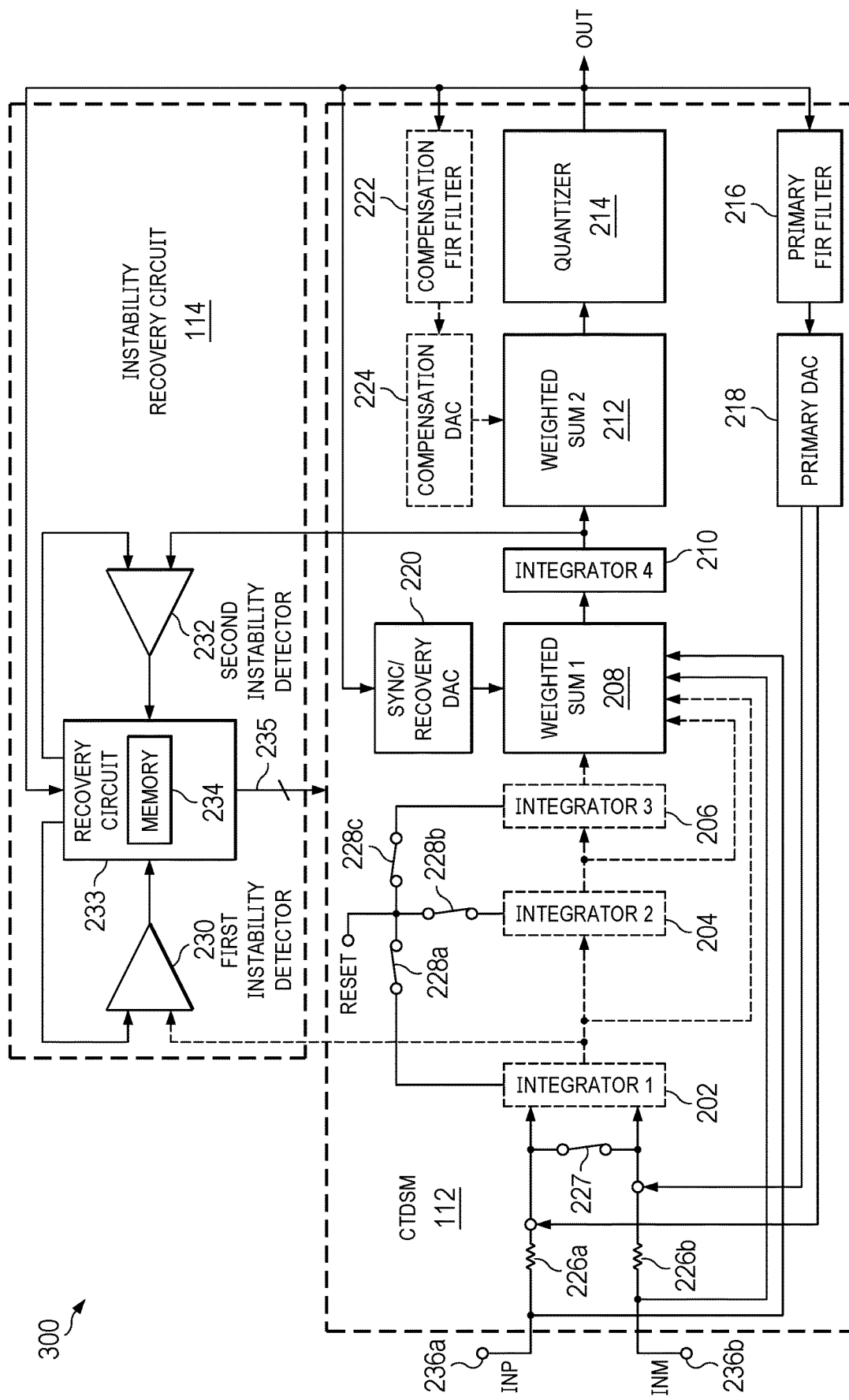
FIG. 3 is a functional block and circuit diagram of an example of a second operating state of the CTDSM and instability recovery circuit of FIGS. 1A and 1B.

FIG. 3 is a functional block and circuit diagram of an example of the second operating state 300 of the CTDSM 112 and instability recovery circuit 114 of FIGS. 1A and 1B. In the second operating state 300, the recovery circuit 233 controls the first, second, and third switches 228 to close, thereby controlling the first, second, and third integrators 202, 204, and 206 to provide respective null signals. This leaves the output signal of the fourth integrator 210 to determine the input signal of the quantizer 214. Accordingly, in the second operating state 300, the CTDSM 112 operates as a first order modulator. In some examples, an output signal closely follows an input signal in first order systems, so that first order systems are inherently stable.

Responsive to the first integrator 202 providing a null signal, the primary FIR filter 216 and primary DAC 218 have no effect on the output signal of the quantizer 214. This is because the signal path of the output of the primary DAC 218 goes to the first integrator 202, which, as described, is limited to providing a null output signal while the CTDSM 112 is in the second operating state 300.

In the second operating state 300, the sync/recovery DAC 220 performs a function analogous in some respects to (in some examples, performs the function of) the feedback DAC 128, and the first weighted summer 208 acts as the delta block 122. The recovery circuit 233 adjusts the weights in the first weighted summer 208 and/or activates a return to zero mode of the sync/recovery DAC 220 (described below) to enable this functionality. Accordingly, in the second operating state 300, the output signal of the first weighted summer 208 is responsive to (non-null) signals provided by the input terminals 236 and the sync/recovery DAC 220. In some examples, the sync/recovery DAC 220 provides a negative feedback loop for the CTDSM 112 at a high sampling rate. Accordingly, the sampling rate of the oversampling circuit 118 is not lowered during operation in the second operating state 300.

In the second operating state 300, the fourth integrator 210 and the second weighted summer 212 act as the sigma block 124. The recovery circuit 233 adjusts the weights in the second weighted summer 212 to enable this functionality.

In some examples, in the first operating state 200, the sync/recovery DAC 220 operates in a non-return to zero (NRZ) mode, and in the second operating state 300, the sync/recovery DAC 220 operates in a return to zero (RZ) mode. In the NRZ mode, the sync/recovery DAC 220 transitions, on a corresponding clock edge (such as a rising or falling clock edge), from an output signal corresponding to an old input signal received by the sync/recovery DAC 220 to an output signal corresponding to a new input signal received by the sync/recovery DAC 220, without returning to a zero signal between the old and new output signals.

In the RZ mode, the sync/recovery DAC 220 provides an output signal corresponding to the input signal of the sync/recovery DAC 220 for half of each clock cycle, such as following a rising clock edge, and returns to providing a zero signal for half of each clock cycle, such as following a falling clock edge. The RZ mode adds predictability to the output signal of the sync/recovery DAC 220 and reduces the weight of the output signal of the sync/recovery DAC 220 by one-half, as seen by the input of the quantizer 214. The RZ mode adds predictability because the sync/recovery DAC 220 has a known output signal for half of each clock cycle. Also, switching to RZ mode provides a convenient method of retuning loop coefficients corresponding to the sync/recovery DAC 220 so that a designed NTF can be achieved, with designed resolution and precision, during operation in the second operating state 300.

As described above, to increase stability of the CTDSM 112 while operating in the second operating state 300, the recovery circuit 233 controls the compensation FIR filter 222 and the compensation DAC 224 to provide a null signal. Accordingly, in the second operating state 300, the compensation FIR filter 222 does not affect an input signal of the quantizer 214. Also, as described above, because the first integrator 202 provides a null output signal, the primary FIR filter 216 does not affect input to the quantizer 214. This also increases stability of the CTDSM 112.

In the second operating state 300, input signals of the primary FIR filter 216 continue to be updated by the output signal of the quantizer 214. Updating the input signals of the primary FIR filter 216 updates the internal multi-sample filter components of the primary FIR filter 216. Accordingly, use of the sync/recovery DAC 220 and the first weighted summer 208 to provide a shortened loop-filter for the CTDSM 112 avoids instability related to the output signal of the primary FIR filter 216 without bypassing or suppressing the input of the primary FIR filter 216.

Stability impact from this updating is avoided because the first integrator 202 receives a null signal corresponding to the recovery switch 227 being closed, and provides a null signal corresponding to the first switch 228a being closed. The recovery switch 227 being closed also enables the signal path culminating with the primary FIR filter 216 and primary DAC 218 to act as a closed loop, so that the primary FIR filter 216 and primary DAC 218 can update without interference from the differential input signal, which is shorted by the recovery switch 227. This enables the primary FIR filter 216 to continue to be updated while the CTDSM 112 is in the second operating state 300.

The closed shorting switches, switches 227 and 228a, also enable the primary FIR filter 216 and primary DAC 218 to accurately determine the output signal. Accurate determination of the output signal enables initialization of the primary FIR filter 216 and primary DAC 218 to provide accurate feedback on return to nominal operation (the first operating state 200). Accurate feedback promotes stable operation. Further, switches 227 and 228a being closed keeps the primary FIR filter 216 and primary DAC 218 out of the CTDSM 112 feedback loop, so that they do not erroneously affect operation in the second operating state 300. In some examples, the second operating state 300 is referred to as a signal estimation mode in response to the accurate continued updating of the primary FIR filter 216 and primary DAC 218.

The primary FIR filter 216 and primary DAC 218 can be kept out of the CTDSM 112 feedback loop because the sync/recovery DAC 220 provides a negative feedback loop to enable continued operation of the CTDSM 112 during the second operating state 300. The negative feedback loop via the sync/recovery DAC 220 enables shaping of the quantization noise by moving quantization noise from the signal band to higher frequencies (such as frequencies outside a range allowed by the lowpass digital filter 120). As described above, oversampling enables further accuracy improvement.

As described, continued updating of the primary FIR filter 216 during operation in the second operating state 300 enables continued stable operation of the CTDSM 112 while the modulator recovers from operation as a first order modulator in the second operating state 300 to return to operation as a fourth order modulator in the first operating state 200. This avoids a period of instability that could be caused if inputs of the primary FIR filter 216 and/or primary DAC 218 were bypassed during recovery, and this bypass ended after return of the CTDSM 112 to normal operation.

Recall that the first instability detector 230 receives a null input signal, because the first integrator 202 provides a null output signal, during operation in the second operating state 300. In some examples, the CTDSM 112 exits the second operating state 300 after a voltage of the output signal of the fourth integrator 210 is less than the second threshold voltage, indicating that the CTDSM 112 has recovered from the saturation or other unstable condition. In some examples, such as with respect to the instability recovery circuit 114 of FIG. 2C, the recovery circuit 233 ignores the second instability detector 232 while the latch 242 is set and while the latch 242 reset signal is applied. In some examples, this corresponds to behavior of the instability recovery circuit of FIG. 2C. In some examples, the recovery circuit 233 ignores the first instability detector 230 and/or the second instability detector 232 from detection of the saturation condition until a predetermined time after return to the first operating state 200. In examples in which the recovery circuit 233 ignores the second instability detector 232, the recovery circuit 233 determines when the output signal of the quantizer 214 returns to a normal operating range, indicating the saturation or other unstable condition has ended. The recovery circuit 233 controls the CTDSM 112 to exit the second operating state 300 in response to this detected end of the saturation or other unstable condition.

In some examples, the recovery circuit 233 does not perform comparisons to determine an end of the saturation or other unstable condition until a selected amount of time has elapsed following entry into the second operating state 300. In some examples, comparison by the second instability detector 232 is also or alternatively suspended until the condition is satisfied. In some examples, the amount of time that comparison by the recovery circuit 233 and/or the second instability detector 232 is suspended corresponds to a number of clock cycles. In some examples, other or additional criteria are used to determine when to exit the second operating state 300. An example amount of time after transition to the second operating state 300 before the recovery circuit 233 starts to perform comparisons to determine a return to normal quantizer 214 output signal behavior is 25 microseconds.

In some examples, comparisons by the recovery circuit 233 to determine whether the CTDSM 112 has returned to stable operation include comparing an output signal of the quantizer 214 to maximum and minimum codes of the quantizer 214. In an example, a maximum code equals 32 and a minimum code equals −32. If the output signal of the quantizer 214 is less than the maximum code and greater than the minimum code, then the recovery circuit 233 checks on subsequent clock cycles, such as for two or three subsequent clock cycles, to determine whether an absolute value of the output signal is decreasing, accordingly, recovering. If so, then the recovery circuit 233 controls the CTDSM 112 to transition to the third operating state 400.

Figure 4:
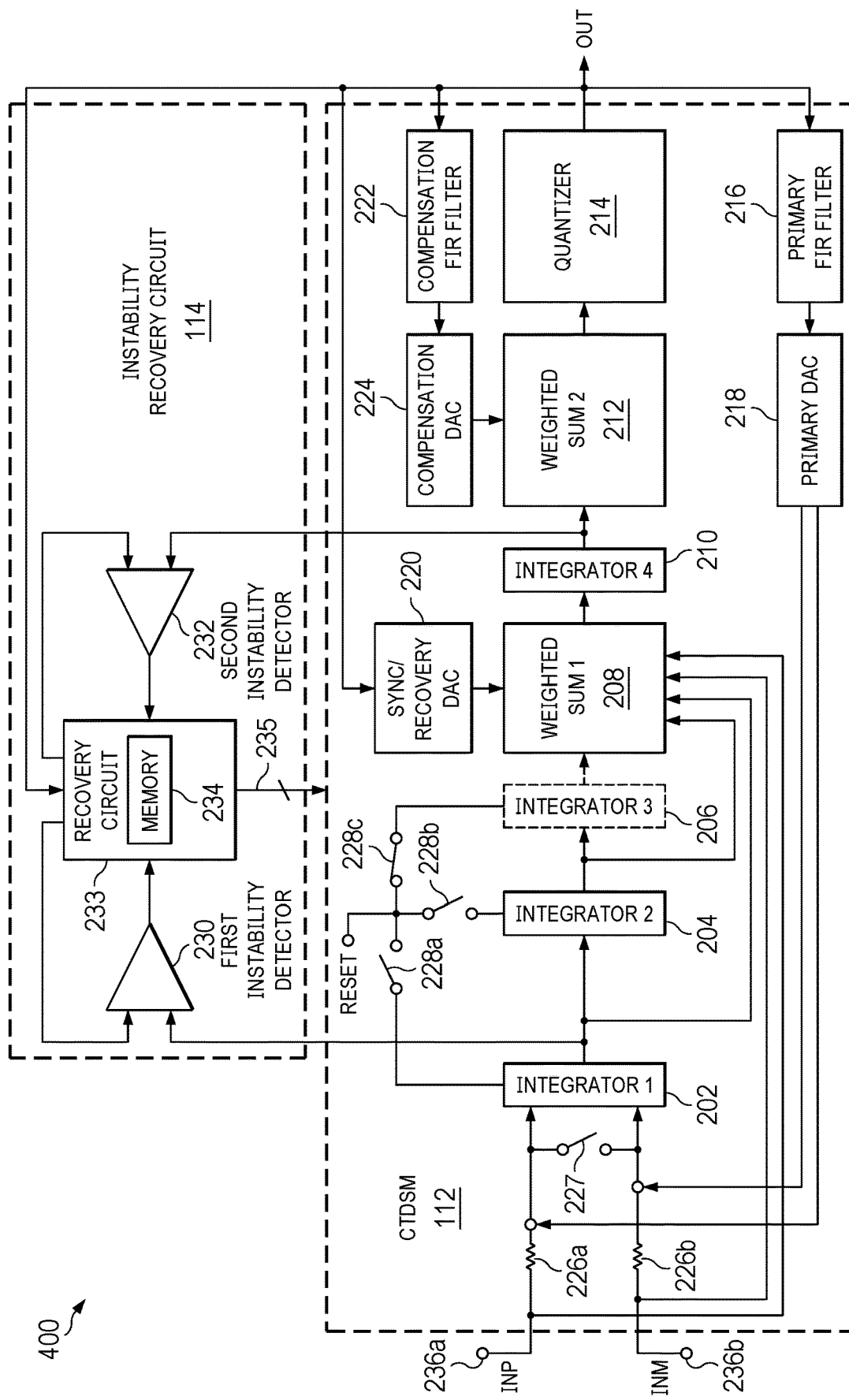
FIG. 4 is a functional block and circuit diagram of an example of a third operating state of the CTDSM and instability recovery circuit of FIGS. 1A and 1B.

FIG. 4 is a functional block and circuit diagram of an example of the third operating state 400 of the CTDSM 112 and instability recovery circuit 114 of FIGS. 1A and 1B. The third operating state 400 is an intermediate recovery state between the second operating state 300 and the first operating state 200. The CTDSM 112 transitions from the second operating state 300 to the third operating state 400 to reduce an amount of change in transition(s) between operating states in a recovery path towards the first operating state 200. Changes between operating states can give rise to instability. Accordingly, operation in the third operating state 400 controls and enables the CTDSM 112 to return to high performance, normal operation in the first operating state 200 with reduced risks, such as transient overshoots, in some examples, very small or no transient overshoots, in the OUT signal.

In the third operating state 400, the recovery circuit 233 controls the recovery switch 227, the first switch 228a, and the second switch 228b to open, thereby controlling the primary FIR filter 216, the primary DAC 218, the first integrator 202, and the second integrator 204 to function normally. The recovery circuit 233 also controls the third switch 228c to close, thereby controlling the third integrator 206 to continue to provide a null signal. The output signals of the first, second, and fourth integrators 202, 204, and 210 determine the input signal of the quantizer 214. Accordingly, in the third operating state 400, the CTDSM 112 operates as a third order modulator. The recovery circuit 233 also controls the compensation FIR filter 222 and compensation DAC 224 to operate normally while the CTDSM 112 is in the third operating state 400. In some examples, normal operation of the compensation FIR filter 222 and compensation DAC 224 refers to them providing or being enabled to provide non-null feedback signals to the second weighted summer 212.

The third operating state 400 is comparable to the first operating state 200, except that the third integrator 206 continues to be controlled to provide a null signal, and the latch 242 remains in a reset state. Accordingly, the recovery circuit 233 adjusts the coefficients of the sync/recovery DAC 220, such as by returning the sync/recovery DAC 220 to operation in NRZ mode. Also, the recovery circuit 233 adjusts the weights of the first and second weighted summer 208 and 212, to enable stable function with a designed NTF. After a selected, e.g., predetermined, amount of time has elapsed after the CTDSM 112 has begun operating in the third operating state 400, the CTDSM 112 transitions to operating in the first operating state 200. An example of the selected time between the transition to the third operating state 400 and the transition to the first operating state 200 is 75 microseconds.

In some examples, the ADC 104 suspends providing an output signal responsive to the CTDSM 112 while the CTDSM 112 is in one or more of the second operating state 300 or the third operating state 400. In some examples, the recovery circuit 233 suspends detecting instabilities in one or more of the second operating state 300 or the third operating state 400, such as discussed above with respect to the latch 242. In some examples, the ADC 104 resumes providing output signals responsive to the CTDSM 112, and/or the recovery circuit 233 resumes detecting instabilities, after a selected, e.g., predetermined, amount of time has elapsed after the CTDSM 112 has resumed operating in the first operating state 200. An example amount of time after the CTDSM 112 resumes operating in the first operating state 200 before the ADC 104 resumes providing an output signal and/or the recovery circuit 233 resumes detecting instabilities is 50 microseconds.

Figure 5:
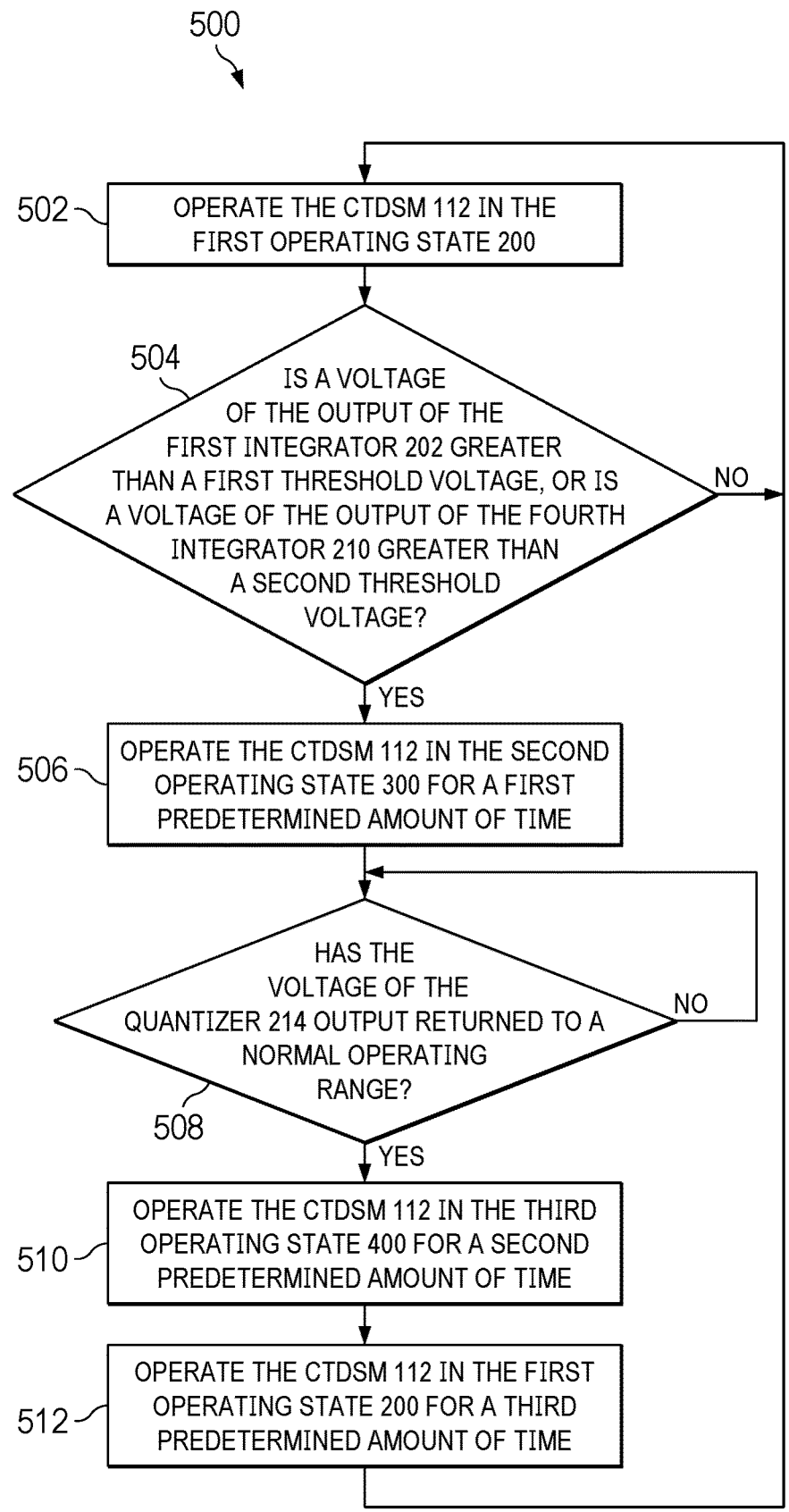
FIG. 5 is an example flow diagram representing a method or process for recovery by the CTDSM from an unstable condition.

FIG. 5 is an example flow diagram representing a method or process 500 for recovery by the CTDSM 112 from an unstable condition. In block 502, the recovery circuit 233 controls the CTDSM 112 to operate in the first operating state 200. In block 504, the first instability detector 230 compares a voltage of the output signal of the first integrator 202 to a first threshold voltage, and the second instability detector 232 compares a voltage of the output signal of the fourth integrator 210 to a second threshold voltage. These checks determine whether the CTDSM 112 is in an unstable condition, such as saturation.

If either threshold is exceeded, then in block 506, the recovery engine 233 controls the CTDSM 112 to operate in the second operating state 300 for a first predetermined amount of time before proceeding to block 508. Otherwise, if neither threshold is exceeded, return to block 502. In some examples, during block 504 operation of the CTDSM 112 in the first operating state 200, block 504 is performed on each clock cycle (such as each rising edge of a clock cycle), or with a different rate.

In block 508, after the first predetermined amount of time has elapsed, the recovery engine 233 checks whether the voltage of the quantizer 214 output signal has returned to a normal operating range of the CTDSM 112, while continuing to control the CTDSM 112 to operate in the second operating state 300. This check corresponds to a determination whether the unstable condition has ended. If the voltage of the quantizer 214 output signal indicates that the CTDSM 112 has returned to normal, stable operation, then proceed to block 510. Otherwise, repeat block 508. This repetition can be performed on each clock cycle (such as each rising edge of a clock cycle), or with a different rate.

In block 510, the recovery engine 233 controls the CTDSM 112 to operate in the third operating state 400 for a second predetermined amount of time. After the second predetermined time has elapsed, in block 512, the recovery engine 233 controls the CTDSM 112 to operate in the first operating state 200 for a third predetermined amount of time. After the third predetermined amount of time has elapsed, return to block 502, so that the CTDSM 112 can resume checking for the saturation condition in iterations of block 504.

In some examples, circuits described herein, such as the CTDSM 112 or the instability recovery circuit 114, can be implemented using a processor such as a CPU, DSP, or MCU.

In some examples, processes described herein are implemented using software, hardware, or a combination of software and hardware.

In some examples, the sigma block includes a number of integrators other than four.

In some examples, design tools and/or MATLAB or other analysis is used to determine weights used by the weighted summers 208 and 212. In some examples, analysis and simulation are used to iteratively refine modulator design and/or weight allocation.

In some examples that do not include the primary FIR filter 216 (or other FIR filters), the CTDSM 112 becomes unstable responsive to a step input or a signal exceeding the MSA of the CTDSM 112. Some example CTDSM designs include other variations on the CTDSM 112 described herein. The systems and processes described herein may also be applied to such variant CTDSM designs.

In some examples, the differential analog input corresponding to INP and INM, provided by the input terminals 236, can be described as a first input of the first integrator 202. In some examples, the differential outputs of the primary DAC 218 can be described as providing a second input of the first integrator 202.

In some examples, the instability detectors 230 and 232 remain effective during the second and/or third operating state(s) 300 and/or 400. In some such examples, threshold voltages are determined responsive to whether the CTDSM 112 is in the first operating state 200 or a different operating state.

In some examples, the recovery circuit 233 can change or select threshold voltages or other parameters stored in the memory 234, such as in response to instructions from a user.

In some examples, the recovery circuit 233 controls a clock signal to which timing of signal processing by the sigma block 124 and of sampling by the sampling quantizer 126 are responsive.

In some examples, the operating states are referred to as modes of the CTDSM.

In some examples, an oversampling ratio equals a sampling frequency ($f_s$) divided by two times the Nyquist frequency. In some examples, a CTDSM 112 provides an improvement in SQNR of (6N+3) dB with each doubling of the oversampling ratio, where N is the order of the modulator. In some examples, an oversampling rate is approximately 64 times a Nyquist frequency corresponding to an audio bandwidth, or approximately 64 times another sampling rate responsive to the audio bandwidth.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Modifications are possible in the described examples, and other examples are possible within the scope of the claims.

What is claimed is:

1. An integrated circuit (IC) comprising:
a first integrator having first input, a second input, and an output;
a first weighted summer having an analog signal input, a second input, a third input, and an output, the analog signal input of the first weighted summer coupled to the analog signal input of the first integrator, and the second input of the first weighted summer coupled to the output of the first integrator;
a second integrator having an input and an output, the input of the second integrator coupled to the output of the first weighted summer;
a second weighted summer having an input and an output, the input of the second weighted summer coupled to the output of the second integrator;
a quantizer having an input and an output, the input of the quantizer coupled to the output of the second weighted summer;
a first digital-to-analog converter (DAC) having an input and an output, the input of the first DAC coupled to the output of the quantizer and the output of the first DAC coupled to the second input of the first integrator; and
a second DAC having an input and an output, the input of the second DAC coupled to the output of the quantizer and the output of the second DAC coupled to the third input of the first weighted summer.

2. The IC of claim 1, further comprising:
a first comparator having a first input coupled to the output of the first integrator, a second input, and an output;
a second comparator having a first input coupled to the output of the second integrator, a second input, and an output; and
a recovery circuit having a first input, a second input, a first output, and a second output, the first input of the recovery circuit coupled to the output of the first comparator, the second input of the recovery circuit coupled to the output of the second comparator, the first output of the recovery circuit coupled to the second input of the first comparator, the second output of the recovery circuit coupled to the second input of the second comparator.

3. The IC of claim 1,
wherein the output of the first integrator is a first output, the first integrator having first and second outputs that are differential outputs, and the input of the first weighted summer is a first input, the first weighted summer having first and second inputs that are differential inputs;
the IC further comprising a switch having a first terminal, a second terminal, and a control terminal, the first terminal of the switch coupled to the first output of the first integrator, and the second terminal of the switch coupled to the second output of the first integrator.

4. The IC of claim 1, further comprising:
a latch having a first input, a second input, a third input, and an output;
a first comparator having a first input coupled to the output of the first integrator, a second input, and an output coupled to the first input of the latch;

a second comparator having a first input coupled to the output of the second integrator, a second input, and an output coupled to the second input of the latch; and a recovery circuit having a first and second inputs and first, second, and third outputs, the first input of the recovery circuit coupled to the output of the latch, the second input of the recovery circuit coupled to the output of the quantizer, the first output of the recovery circuit coupled to the second input of the first comparator, the second output of the recovery circuit coupled to the second input of the second comparator, and the third output of the recovery circuit coupled to the third input of the latch.

5. The IC of claim 4, wherein the recovery circuit is coupled to respective control inputs of the first integrator, the first weighted summer, the second weighted summer, and the second DAC.

6. The IC of claim 1,
wherein the output of the first DAC is a second output, the first DAC having first and second outputs that are differential outputs, the first and second inputs of the first integrator are respective first and second analog signal inputs that are differential inputs, and the first analog signal input of the first DAC is coupled to the first output of the first DAC;

the IC further comprising a switch having a first terminal, a second terminal, and a control terminal, the first terminal of the switch coupled to the first input of the first integrator and the first output of the first DAC, and the second terminal of the switch coupled to the second input of the first integrator and the second output of the first DAC.

7. The IC of claim 1, further comprising:
a third integrator having an input and an output, the input of the third integrator coupled to the output of the first integrator; and a fourth integrator having an input and an output, the input of the fourth integrator coupled to the output of the third integrator, and the output of the fourth integrator coupled to the input of the first weighted summer.

8. The IC of claim 1, further comprising a finite impulse response (FIR) filter having an input and an output, the input of the FIR filter coupled to the output of the quantizer, and the output of the FIR filter coupled to the input of the first DAC.

9. The IC of claim 1, wherein the second weighted summer has a second input, the IC further comprising:
a third DAC having an input and an output, the output of the third DAC coupled to the second input of the second weighted summer; and a finite impulse response (FIR) filter having an input and an output, the input of the FIR filter coupled to the output of the quantizer, and the output of the FIR filter coupled to the input of the third DAC.

10. An integrated circuit (IC) comprising:
a delta-sigma modulator (DSM) including a number integrators, a first digital-to-analog converter (DAC), a second DAC, and a quantizer, wherein N is greater than one; and a control circuit configured to:
in a first mode, operate the DSM as an Nth order modulator, so that the first DAC provides a first feedback signal responsive to an output of the quantizer, and so that outputs of the N integrators are responsive to the first feedback signal;
in a second mode, operate the DSM as a first order modulator, so that the second DAC provides a second feedback signal responsive to the output of the quantizer, and so that an output of the quantizer is responsive to an output of a single one of the N integrators and to the second feedback signal and not to the first feedback signal; and switch from the first mode to the second mode responsive to an output of an integrator and a threshold.

11. The IC of claim 10,
wherein the N integrators are coupled in series from a first integrator that has an input coupled to an output of the first DAC to a last integrator that has an output coupled to an input of the quantizer; and wherein the control circuit is configured to switch from the first mode to the second mode responsive to at least one of: an output of the first integrator and a first threshold, or an output of the last integrator and a second threshold.

12. The IC of claim 11,
wherein the first threshold corresponds to a high frequency change in input voltage; and
wherein the second threshold corresponds to a high amplitude level in input voltage.

13. The IC of claim 10,
further comprising a finite impulse response (FIR) filter;
wherein the first DAC provides the first feedback signal responsive to a filtered signal provided by the FIR filter responsive to the output of the quantizer; and
wherein the FIR filter continues to update responsive to the output of the quantizer responsive to the control circuit operating the DSM in the second mode.

14. The IC of claim 13, wherein the control circuit is configured to cause differential outputs of the first DAC to be shorted together in the second mode.

15. The IC of claim 10,
wherein, in the first mode, the control circuit controls the second DAC to operate in a non-return to zero mode; and
wherein, in the second mode, the control circuit controls the second DAC to operate in a return to zero mode.

16. The IC of claim 10,
wherein the N integrators are coupled in series from a first integrator that has an input coupled to an output of the first DAC to a last integrator that has an output coupled to an input of the quantizer;
wherein the N integrators include a second integrator having an input coupled to an output of the first integrator, and a third integrator having an input coupled to an output of the second integrator; and
wherein, in a third mode, the control circuit is configured to operate the DSM as a modulator of order less than N and greater than two, so that the first, second, and last integrators provide valid outputs, and the third integrator provides a null signal output.

17. The IC of claim 10, wherein the control circuit is configured to switch out of the second mode towards the first mode in response to the output of the quantizer corresponding to a signal level within a normal operating range of the DSM.

18. The IC of claim 10, wherein the control circuit is configured to adjust a weight of an integrator and a weight of the second DAC as part of switching to the second mode.

19. A system comprising:
a lowpass analog filter having an analog signal input and an output;
a sampling circuit having an input and an output, the input of the sampling circuit coupled to the output of the lowpass analog filter;

a first integrator having a first input, a second input, and an output, the first input of the first integrator coupled to the output of the sampling circuit;

a first weighted summer having an first input, a second input, a third input, and an output, the first input of the first weighted summer coupled to the output of the sampling circuit, and the second input of the first weighted summer coupled to the output of the first integrator;

a second integrator having an input and an output, the input of the second integrator coupled to the output of the first weighted summer;

a second weighted summer having an input and an output, the input of the second weighted summer coupled to the output of the second integrator;

a quantizer having an input and an output, the input of the quantizer coupled to the output of the second weighted summer;

a first digital-to-analog converter (DAC) having an input and an output, the input of the first DAC coupled to the output of the quantizer and the output of the first DAC coupled to the second input of the first integrator;

a second DAC having an input and an output, the input of the second DAC coupled to the output of the quantizer and the output of the second DAC coupled to the third input of the first weighted summer;

a lowpass digital filter having an input and an output, the input of the lowpass digital filter coupled to the output of the quantizer.

20. The system of claim 19, further comprising:

a digital signal processing circuit (DSP) having an input and an output, the input of the DSP coupled to the output of the lowpass digital filter; and a third DAC having an input and an output, the input of the third DAC coupled to the output of the DSP.

* * * * *